United States Patent
Bauer (10) Patent No.: US 9,570,124 B2
(45) Date of Patent: Feb. 14, 2017

(54) HIGH SPEED LOGGING SYSTEM

(71) Applicant: Viavi Solutions Inc., Milpitas, CA (US)

(72) Inventor: Samuel M. Bauer, Colorado Springs, CO (US)

(73) Assignee: Viavi Solutions Inc., Milpitas, CA (US)

(*) Notice: Subject to any disclaimer, the term of this patent is extended or adjusted under 35 U.S.C. 154(b) by 244 days.

(21) Appl. No.: 13/737,206

(22) Filed: Jan. 9, 2013

(65) Prior Publication Data

US 2013/0179821 A1 Jul. 11, 2013

Related U.S. Application Data

(60) Provisional application No. 61/585,491, filed on Jan. 11, 2012.

(51) Int. Cl.
| | | |
|---|---|---|
| *G11C 7/10* | (2006.01) | |
| *G06F 3/0481* | (2013.01) | |
| *H04L 12/24* | (2006.01) | |
| *G06F 11/14* | (2006.01) | |

(52) U.S. Cl.
CPC ........... *G11C 7/1072* (2013.01); *G06F 3/0481* (2013.01); *H04L 41/069* (2013.01); *H04L 41/0686* (2013.01); *H04L 41/22* (2013.01); *G06F 11/1448* (2013.01); *G06F 11/1458* (2013.01)

(58) Field of Classification Search
CPC .. G06F 3/0481; G06F 3/0656; G06F 11/1448; G06F 11/1458; H04L 41/22; H04L 41/0686; H04L 41/069; G11C 7/1072
See application file for complete search history.

(56) References Cited

U.S. PATENT DOCUMENTS

| | | | | |
|---|---|---|---|---|
| 4,458,316 A | * | 7/1984 | Fry | G06F 13/122 710/5 |
| 5,297,258 A | * | 3/1994 | Hale | G06F 3/0601 711/113 |
| 5,860,105 A | * | 1/1999 | McDermott | G06F 12/0804 711/100 |
| 5,933,593 A | * | 8/1999 | Arun | G06F 11/1451 711/126 |
| 6,199,070 B1 | * | 3/2001 | Polo-Wood et al. | |
| 6,523,102 B1 | * | 2/2003 | Dye | G06F 12/023 709/247 |
| 7,017,018 B1 | * | 3/2006 | Beckett et al. | 711/159 |
| 7,039,921 B2 | * | 5/2006 | Shah et al. | 719/318 |
| 7,336,673 B2 | | 2/2008 | Ilnicki et al. | |
| 7,539,134 B1 | * | 5/2009 | Bowes | 370/230 |

(Continued)

OTHER PUBLICATIONS

Dave Marshall, "IPC: Message Queues", Jan. 5, 1999, retrieved on Jan. 23, 2015, retrieved from <http://www.cs.cf.ac.uk/Dave/C/node25.html>, pp. 1-17.*

*Primary Examiner* — Ajay Bhatia
*Assistant Examiner* — Nicholas Klicos
(74) *Attorney, Agent, or Firm* — Harrity & Harrity, LLP (57) ABSTRACT

A method of storing log entries of events from a plurality of network elements in a communication network, comprising the steps of: a) receiving log entries at a control processor of events from a plurality of different elements positioned, the log entries grouped into threads based on a common purpose; b) converting each log entry into a compact log record in a logging module, and c) storing the compact log records in a first memory buffer in random access memory (RAM) forming a first log file.

20 Claims, 4 Drawing Sheets

(56) References Cited

U.S. PATENT DOCUMENTS

| | | | |
|---|---|---|---|
| 7,573,914 B2 | 8/2009 | Ilnicki et al. | 370/519 |
| 7,689,854 B2 | 3/2010 | Ilnicki et al. | 713/400 |
| 7,730,238 B1* | 6/2010 | Arulambalam | G06F 5/06 |
| | | | 370/412 |
| 7,739,374 B1* | 6/2010 | Frey et al. | 709/224 |
| 7,760,663 B2 | 7/2010 | Ilnicki et al. | 370/254 |
| 7,868,780 B2 | 1/2011 | Engel et al. | 340/870.07 |
| 7,894,356 B2 | 2/2011 | Mottishaw et al. | 370/252 |
| 7,948,974 B2 | 5/2011 | Ilnicki et al. | 370/366 |
| 8,009,557 B2 | 8/2011 | Curran-Gray et al. | 370/229 |
| 2002/0165902 A1* | 11/2002 | Robb et al. | 709/202 |
| 2002/0198983 A1* | 12/2002 | Ullmann et al. | 709/224 |
| 2003/0065764 A1* | 4/2003 | Capers et al. | 709/224 |
| 2004/0107318 A1* | 6/2004 | Bono | G06F 12/0866 |
| | | | 711/118 |
| 2004/0128470 A1* | 7/2004 | Hetzler | G06F 12/0804 |
| | | | 711/209 |
| 2004/0143710 A1* | 7/2004 | Walmsley | 711/144 |
| 2005/0010929 A1* | 1/2005 | Wang et al. | 719/318 |
| 2005/0027783 A1* | 2/2005 | Green et al. | 709/200 |
| 2005/0094567 A1* | 5/2005 | Kannan et al. | 370/241 |
| 2005/0223282 A1* | 10/2005 | Frey et al. | 714/20 |
| 2006/0143454 A1* | 6/2006 | Walmsley | 713/170 |
| 2006/0184529 A1* | 8/2006 | Berg et al. | 707/8 |
| 2007/0283194 A1* | 12/2007 | Villella et al. | 714/57 |
| 2008/0010401 A1* | 1/2008 | Royer, Jr. | G06F 12/0802 |
| | | | 711/113 |
| 2008/0133615 A1* | 6/2008 | Bradshaw | G06F 12/0866 |
| 2008/0148239 A1* | 6/2008 | Petrov et al. | 717/128 |
| 2008/0262990 A1* | 10/2008 | Kapoor et al. | 706/20 |
| 2009/0049428 A1* | 2/2009 | Cozmei | 717/128 |
| 2009/0070455 A1* | 3/2009 | Cervantes | 709/224 |
| 2009/0109973 A1 | 4/2009 | Ilnicki | 370/392 |
| 2009/0268713 A1* | 10/2009 | Ottur et al. | 370/352 |
| 2009/0287890 A1* | 11/2009 | Bolosky | G06F 3/061 |
| | | | 711/155 |
| 2010/0030986 A1* | 2/2010 | Shinozaki | G06F 3/0613 |
| | | | 711/162 |
| 2010/0174853 A1* | 7/2010 | Lee | G06F 12/0246 |
| | | | 711/103 |
| 2011/0047334 A1* | 2/2011 | Eichenberger | G06F 11/1405 |
| | | | 711/141 |
| 2011/0276542 A1* | 11/2011 | Whitehouse | 707/688 |
| 2011/0276760 A1* | 11/2011 | Chou | 711/118 |
| 2011/0302569 A1* | 12/2011 | Kunze et al. | 717/169 |
| 2012/0124294 A1* | 5/2012 | Atkisson | G06F 11/108 |
| | | | 711/135 |
| 2013/0219328 A1* | 8/2013 | Rosen | G06F 3/0481 |
| | | | 715/781 |

\* cited by examiner

HIGH SPEED LOGGING SYSTEM

CROSS-REFERENCE TO RELATED APPLICATIONS

The present invention claims priority from U.S. Patent Application No. 61/585,491 filed Jan. 11, 2012, which is incorporated herein by reference.

TECHNICAL FIELD

The present invention relates to a data logging system, and in particular to a data logging system for managing test probes in a network testing system.

BACKGROUND OF THE INVENTION

Conventional standalone network probes perform monitoring functions on Internet traffic, and tap into the communication line via a splitter or as an in-line device. The functions typically involve performing some operation on data, inside packets or frames, which is passing through a particular point in the network. Typical functions are, for example, filtering of data, capturing data, forwarding captured data, and summarizing data. Unfortunately, existing probes working as standalone devices configurable to gather data of different types in different arrangements are expensive and require a footprint usually the size of a laptop. Probes that are part of an interface converter or part of a switch or router line card have small footprints, but they have limitations because they are very specific in nature. Thus, when trying to use a probe in a confined space it is necessary to limit the functions that the probe provides in order to use a small footprint probe.

Figure 1:
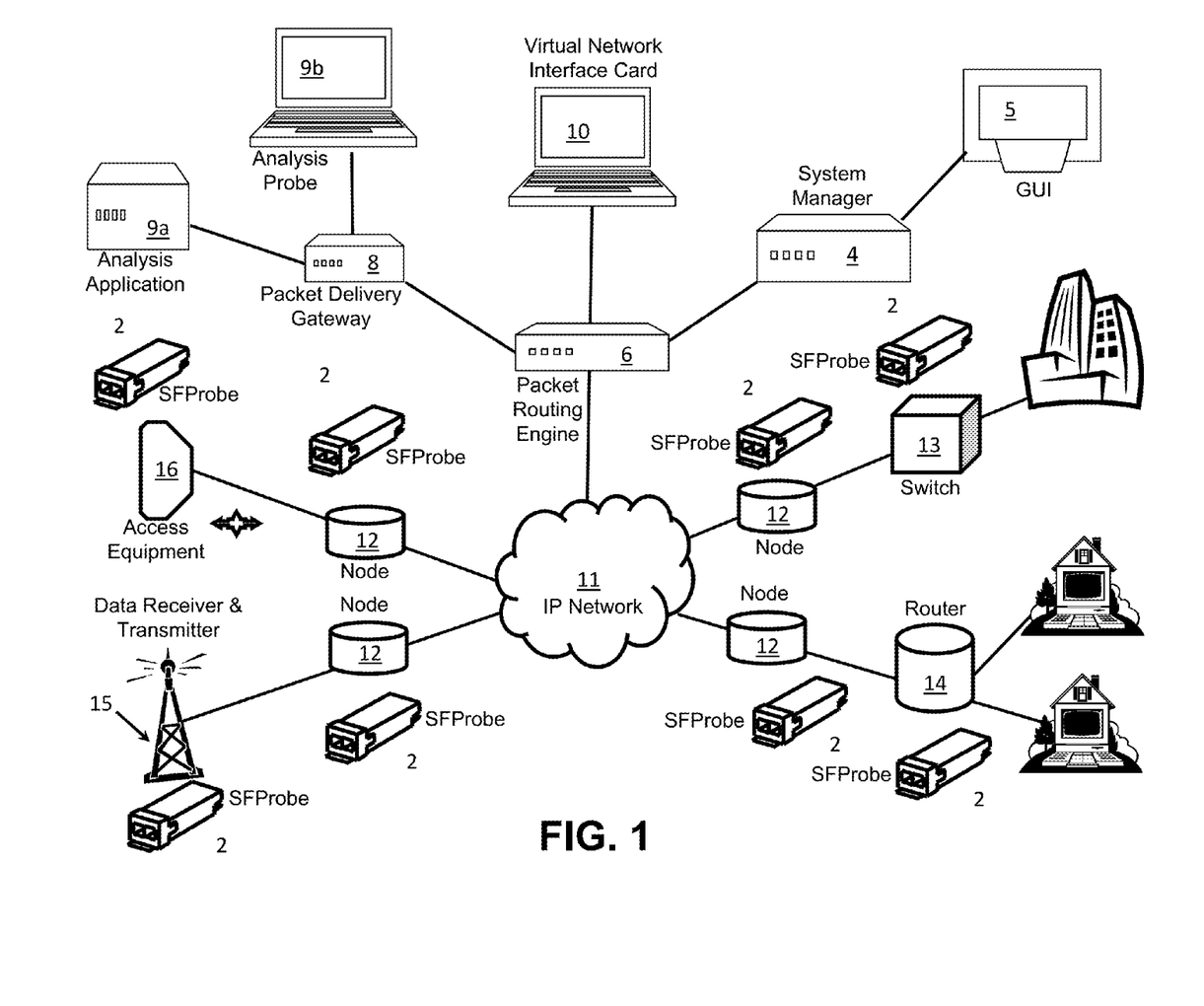
FIG. 1 is a schematic diagram of a distributed network testing system.

With reference to FIG. 1, PacketPortal™ is a software platform that uses passive, inline intelligent packet director (IPD) transceivers or SFProbes 2, to selectively copy and forward packets from an Ethernet network to a target application. Due to the IPD's form factor, e.g. SFP, they can be affordably distributed where traditional probes are not practical, which enables network operators and managers to access packets and data at any point in the network where optical SFPs are used.

The SFProbe 2 is an inline device, which does not require a separate network connection to deliver captured packets. Instead, the SFProbes take advantage of inter-packet gaps and unused bandwidth in a network when messages or test results have to be sent, as disclosed in U.S. Pat. No. 7,948,974 issued May 24, 2011 to Ilnicki et al, and U.S. Pat. No. 8,009,557 issued Aug. 30, 2011 to Curran-Gray et al., which are incorporated herein by reference. When an idle period is detected, a results packet is inserted into the network for routing back to the system and subsequently the destination application or tools. Accordingly, no network packets are dropped while passing through the SFProbes 2.

The PacketPortal solution examines packets at full-duplex line-rate speeds, empowering the IPD to identify packets of interest that are then copied from the network, accurately time-stamped, encapsulated into a results packet, and inserted back into the network for routing to the targeted application—all without causing loss or disruption to the original flows, as disclosed for example in U.S. Pat. No. 7,894,356, issued Feb. 22, 2011 to Mottishaw et al., which is incorporated herein by reference.

A System Manager 4 provides user management and system access through an easy-to-use, web-based graphical user interface (GUI) 5 that users can access through any compliant browser. The intuitive user interface of the System Manager 4 enables quick easy access to the features, functionality, and management of the entire system.

A Packet Routing Engine (PRE) 6 provides scalable management and control of the SFProbes 2 across the network. Currently each PRE 6 can manage and control up to 500 SFProbes 2; however, future PRE 6 will be able to support thousands of SFProbes 2. Each PRE 6 maintains network connections, state, time synchronization, encryption, and discovery, and they route captured result packets for the SFProbes 2 in their domain. Decoupling the functions of the PRE 6 from those of the central System Manager 4 lets a PacketPortal system scale to sizes never before conceived of for packet-access solutions. PRE's 6 may be synchronized with a global time source, such as a global positioning system (GPS), network time protocol (NTP), IEEE 1588 master clock, as disclosed for example in U.S. Pat. No. 7,573,914 issued Aug. 11, 2009, and U.S. Pat. No. 7,689,854 issued Mar. 30, 2010 both in the name of Ilnicki et al., which are incorporated herein by reference.

To simplify data and packet acquisition, every SFProbe 2 incorporates a protocol header parser (PHP) that automatically identifies most major protocols over virtually any network encapsulation. The PHP works in conjunction with four programmable filter banks, which may be activated in every SFProbe 2. Each filter bank may hold up to eight bidirectional independent filter patterns that define the network traffic to be captured and forwarded. Users can set up simple or complex filters using the GUI 5 from the System Manager 4, as disclosed for example in U.S. Pat. No. 7,760,663 issued Jul. 20, 2010 to Ilnicki et al, which is incorporated herein by reference.

A Packet Delivery Gateway (PDG) 8 enables one or more applications, e.g. analysis application 9a or analysis probe 9b, to connect to the PacketPortal system and receive time-aligned packets, as if they were locally connected to a monitor port or tap at the remote location. The PDG uses captured timestamps and sequence numbers from the SFProbes 2 to play aggregated streams out a monitor port. The streams maintain proper sequencing and inter-packet timing that represents what the packets experienced while passing through the remote network port. PDG's 8 can feed packets to any device or application that would normally connect to a tap, SPAN port, aggregator, mirror port or equivalent technology. The PDG 8 enables applications to reside in central locations instead of remote locations, where it may not be economically practical to deploy. Accordingly, the PDG 8 provides the ability to utilize legacy and even future probes and test systems with the PacketPortal system.

A virtual network interface card 10 (VNIC) is a software component that emulates a physical network interface card (NIC) driver and enables any Ethernet-based software application to receive feeds from a PacketPortal system via a NIC interface. The VNIC receives Packet Portal feeds, removes the transport headers and metadata to reveal the network traffic, and retransmits the original packets to the PC's network stack. The traffic is replayed using the original capture timestamps and sequence numbers to accurately represent the traffic as it was captured at the remote element. The replay may be configured to output on a specific transmission control protocol (TCP) or user datagram protocol (UDP) port from the PRE 6 to the VNIC 10. The VNIC 10 can also read captured network data files in the packet capture (PCAP) format and replay them similarly to how live traffic is processed through the PacketPortal system.

The SFProbes 2 can be located in various locations connected to a core IP network 11, such as nodes 12, switches 13, routers 14, data receivers and transmitters 15, and any other access equipment 16, e.g. DSLAM, CMTS, OLT etc.

High complexity software applications utilizing many threads of execution are difficult to analyze and debug. As the application is scaled to process more and more work, this analysis and debugging becomes much more difficult. Logging that contains information that can provide a picture of the complex interactions of all execution threads over time is needed. Application performance tuning requires that the logging is also fast enough to have very little impact on overall execution performance to allow analysis of the application running at speed. Logging may also contain information that the customer or someone trying to reverse-engineer the application should not see. The present invention logs a rich set of information in a binary record format that is obfuscated and so compact that it is very fast to write.

An object of the present invention is to overcome the shortcomings of the prior art by providing a high speed logging system that stores compacted log records in a first memory buffer in random access memory (RAM).

SUMMARY OF THE INVENTION

Accordingly, the present invention relates to a method of storing log entries of events from a plurality of network elements in a network, comprising the steps of:

a) receiving log entries at a control processor of events from a plurality of different elements positioned, the log entries grouped into threads based on a common purpose;

b) converting each log entry into a compact log record in a logging module, each compact log record comprising in binary form:
  record length of the compact log record;
  time stamp of data collection at the network element;
  thread ID of the thread that logged each event;
  category of each event;
  message ID for identifying static text for a human readable log message; and
  network element ID for identifying to which network element the event relates; and c) storing the compact log records in a first memory buffer in random access memory (RAM) forming a first log file.

BRIEF DESCRIPTION OF THE DRAWINGS

The invention will be described in greater detail with reference to the accompanying drawings which represent preferred embodiments thereof, wherein.

DETAILED DESCRIPTION

The present invention is ideally suited for managing test probes in a communications network, such as those PacketPortal SFProbes disclosed in U.S. Pat. No. 7,336,673 issued Feb. 26, 2008 to Ilnicki et al entitled Creating a Low Bandwidth Channel Within a High Bandwidth Packet Stream; and U.S. Pat. No. 7,868,780 issued Jan. 11, 2011 to Engel et al entitled System and Method for Test Probe Management, and United States Patent Application of 2009/0109973 published Apr. 30, 2009 in the name of Ilnicki, entitled Programmable Passive Probe, which are incorporated herein by reference. However, other applications that do not manage probes, could categorize log events by some other grouping that would make sense to the application. For example, an application that manages or monitors cell phone communications may want to organize them by phone number.

The software logging module 21, in accordance with the present invention, is typically stored on non-transitory computer readable media, such as a fixed magnetic disk, floppy disk drive, optical disk drive, magneto-optical disk drive, magnetic tape, or non-volatile memory, and provides logging methods so that a programmer can instrument the application code with informational and error log statements. In the embodiment illustrated in FIG. 2, the module 21 is used to store test-data signals, e.g. packets, from test probes, e.g. SFProbes 22, which are controlled by a system manager 24 via GUI 25, and positioned throughout a network at various network elements. An example of a suitable network is a core IP network 11 with network elements, such as nodes 12, switches 13, routers 14, data receivers and transmitters 15, and any other access equipment 16, e.g. DSLAM, CMTS, OLT etc.

Figure 2:
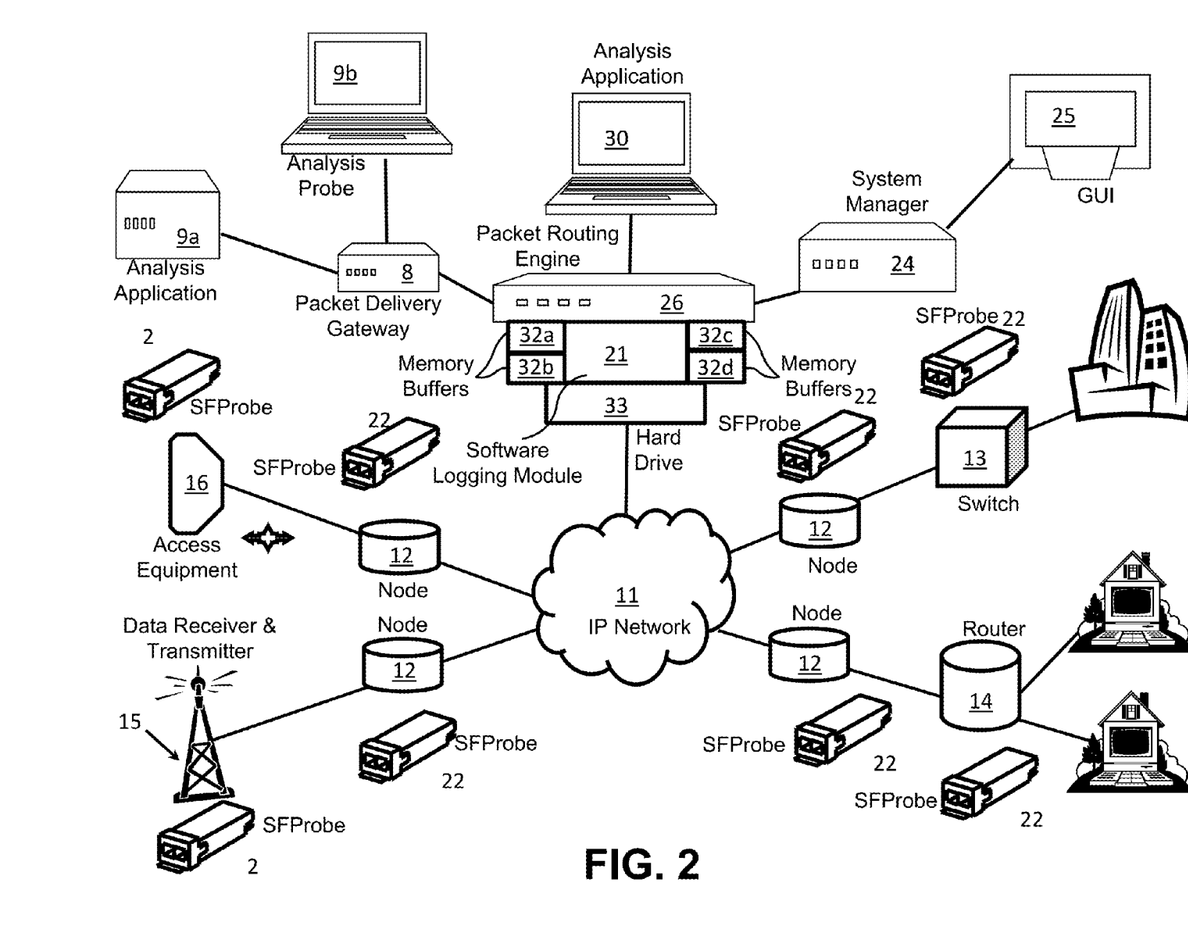
FIG. 2 is a schematic diagram of a distributed network testing system including the logging system of the present invention.

Similar test-data signals collected for a similar purpose from each of the different SFProbes 22 are grouped into threads, as initiated by the system manager 24. Typically the module 21 is stored in conjunction with a packet routing engine (PRE) 26 or an analysis application 30, e.g. a virtual network interface card. For each logging line added by the programmer, the logging module 21 will create a compact log record, which ideally comprises essential variable data, e.g. a Time-stamp, a process or Thread ID, message Category or type, other enrichment data that is present for every logged message, Probe (or element) ID, and variable data that varies depending on the Message ID being logged, along with compacted data in the form of one or more code numbers, e.g. a Message ID, representing, e.g. full length text strings from a predetermined list of text strings. The Message ID is one of a plurality of predetermined code numbers, each corresponding to predetermined data or text string, whereby each compact log record comprises fewer bits than the corresponding full length log record, thereby requiring less memory (RAM or ROM) to store. The Time-stamp and Probe ID are formatted as well. The Event Type is a string that the log viewer knows from the binary type in the record.

Then as the code executes, each time a log statement is executed, one compact log record is added to a first one of a plurality of memory buffers (RAM) 32*a* to 32*d*.

The binary compact log file is a series of compact log event records. Ideally, each record is comprised of the following elements:
  Record Length of the compact log record, so the end of the compact log record can easily be determined;
  Time Stamp of the data collection at the network element;
  Thread ID: The program thread of execution that logged this event;
  Category or Type of each event, e.g. Warning, Error, Information, etc;
  Message ID: Corresponds to static text needed to construct a human readable log message.

Element (or Probe) ID: Application specific, e.g. when used for software that manages probes 22, helps identify where and/or which element and probe, the message pertains to.

Variable data: Depends on the message being logged.
0 to 4, 32 bit integers
0 to 2, 32 character string.

Other records can be logged into the binary log file, and some of the records can be omitted, depending on the nature of the application.

When the compact log records are to be viewed, a log file viewer program, converts the compact log records in the log file into displayable strings and displays them on a suitable GUI. To do this, the log file viewer takes the binary log file and an auxiliary mapping file that contains the mapping of Message ID to text.

Each binary log record can vary in size, i.e. record length, depending on how much variable data is included. The log viewer must process all of these binary records, and the Record Length, enables the log viewer to know how long each record is and therefore, where the next record begins.

When the first memory buffer 32a gets full, then a second different memory buffer 32b is allocated by the logging module 21 and used for future log records. In the illustrated system the buffer size and number of buffers is configurable. Depending on the size of the buffers 32a to 32d and how many log events are generated, the buffers 32a to 32d can fill in milliseconds or in minutes. The more heavily loaded the system is, the more work it is doing, the more events are generated. Example: an event may be a specific Message Type is sent to a probe 22. Another event is an Acknowledgement is received from a probe 22. The full, first memory buffer 32a is queued to a background thread that writes it to a disk file on a hard drive 33 and then puts the memory buffer 32a back into the free pool so that it can be used again at a future time. Accordingly, if only two buffers 32a and 32b are provided, the logging module 21 will alternate between them; however, if additional buffers, e.g. 32c and 32d are provided, the additional buffers can be used.

What makes the system, and in particular the logging module 21, high-speed, which is very important in debugging high speed applications, is that the compact log files are stored into RAM and flushed later in a background thread to the slower hard drive 33. Logging directly to hard drive 33 would slow the application down too much. The "real" code is high priority running full speed servicing requests to be able to manage so many probes 22 all at once. Events are written to the log buffers 32a to 32d at this high speed, with no perceptible slow-down of the "real" code. When a buffer, e.g. 32a, is full, the log code moves its write pointers to a fresh buffer, e.g. 32b, and hands the full buffer 32a to a low priority thread that writes the buffer 32a to a hard drive file. This low priority thread only gets to write when there are spare cycles not needed by the high speed threads, i.e. sometimes referred to as 'running in the background'. Accordingly, the full files are transferred whenever the low priority thread gets some processing cycles allocated by the Operating System Scheduler of the logging module 21.

An example of a trace statement in the code is: q
APP_TRACE(INFORMATION,
MESSAGE1_OpenSocketsSizes, m_RecvBuffSize, m_TransBuffSize);

Written as a binary log file to one of the buffers 33a to 33d in the following format:
Timestamp Thread id Type Message id 124928 124928
Timestamp is a numeric representation of time when the record is written. Thread id is an identifier the distinguishes one thread of execution from another. Type is a type of message, like 'error', 'packet transmit', etc—these could change depending on what software application the present invention was being used on. Message id is a number that maps back to some text string that will ultimately be displayed by the visualizing GUI (log viewer)—if the event always displays some text string, only the number is logged, not the text string. The visualize GUI has the mapping of 'message id' to actual text.

The compact log event record takes somewhere on the order of 24 bytes of data. Messages with no variable data take even less. Since it is written to one of the buffers 33a to 33d in raw binary format, no runtime computation is needed for formatting to human readable form.

The log viewer program is stored in non-transitory memory provided in any suitable computer device, e.g. a remote laptop or the system manager 24, and runs separate from the main application under control of a remote processor or the system manager control processor. The log viewer does not require packet portal or any of the packet portal components whatsoever; however the log viewer can be used extensively to tune and debug the PRE component 26 of PacketPortal. The log viewer is a separate application that can run wherever you are able to open a binary log file with it, e.g. binary log files can be retrieved from a PRE server, and stored on a laptop, which uses the log viewer to view the files in full form. The log viewer program takes, as input, two files. First is the compact binary log file and second is a file that contains a mapping of text message strings to message ids. Following is an example of this mapping:

485,"[CCThreadManager::OpenSocketsVersion] Recv buffer size=%d, Transmit buffer size=%d"

From these two input files, the log viewer constructs all of the human readable formatted strings.

Resulting line as viewed in log viewer:
2011-06-01 11:27:40:0023 0234874 [Info] [CCThreadManager::OpenSocketsVersion] Recv buffer size=124928, Transmit buffer size=124928

The line above includes the same information that was logged into one of the buffers 32a to 32d at runtime and later written to the disc file in the hard drive 33—timestamp, thread id, type, message and two pieces of variable data (the buffer sizes). Note that the formatted, expanded line is on the order of 140 bytes of information.

Historically, applications have constructed a full, human readable string and output it directly into a log file at runtime, which produces a huge volume of data and eats processing time in formatting and output.

In troubleshooting any software problem, a key factor is knowing what the code is doing at the time when a problem occurs. Going back and looking though an execution log is one way to see this. Logs can also be looked at when no problem is occurring just to see if any errors are being logged. Software developers can test for bad data or other unexpected conditions and log errors if any is detected.

In the PacketPortal program, the PRE 26 uses this logging almost exclusively. The PRE 26 has on the order of 50 threads of execution, and these log files have been invaluable in finding defects, performance bottlenecks, and other issues. The fact that they are active by default provides a good way to look at what was happening when a problem was encountered, which has even been possible when the PRE 26 is under stressful loads, e.g. managing 1000 PacketPortal probes 22.

The visualization in this example includes color-coding of execution threads. The threads of execution are graphed over time by thread id. Graphic patterns emerge as they are plotted over time, and visual changes in the graphic pattern will indicate a problem that should be looked into.

In the graph, the steady state of an execution thread will have a certain look to it. Every software system of threads, logging events, would likely have a different look pattern in the graph. By comparing execution threads, sections that look much different than other threads will stand out and can indicate a problem area, i.e. interruptions in the usual patterns, new patterns, etc. will visually pop out to the trained eye. This is extremely useful, because without it, changes in behavior would not be easily detectable and would require paging though tens of thousands of lines of text.

Also, the inclusion of a line dedicated to errors allows log entries tagged as errors to be located quickly. For Example: the top line is a where points are plotted for events marked with EventType=Error. This is very useful since most log events are informational. Events that are errors are logged as such. As soon as a log file is opened with the log viewer, events will be seen on the dedicated error line immediately. Clicking on the dot on the graph will scroll to the corresponding line in the text log, so that the specific error and what was happening around it can be seen.

The logged data can also be enhanced by utilizing the individual PacketPortal ProbeID's. Since the software can manage 1000 probes 22 simultaneously, filtering the log viewer to show messages logged for a single probe 22 or subset of probes 22, i.e. by geographic location or by type of host device, e.g. switch, can be very helpful in analyzing what is happening at specific locations in the network or with specific devices therein. In a more general use, other applications may want some other key descriptor that could be associated with each log event record and could be used for sorting or filtering.

The log viewer has been enhanced to use the ProbeID for filtering, which makes interpreting the volumes of logged data much easier. In the log viewer, the log text is searchable by searching through the text, e.g. following events of the same Probe ID, same Thread Id, or same Event Type. The elapsed time between events can also be determined and displayed.

The log viewer has a number of processing threads that each have a different task to perform. For example, there is a single thread whose sole purpose is to read incoming packets from a network socket. Another threads job is to decrypt packets, etc. The threads do work by communicating with all of the probes 22 currently being managed by the system manager software, which is stored in non-volatile memory and executed on the system manager controller 24.

Figure 3:
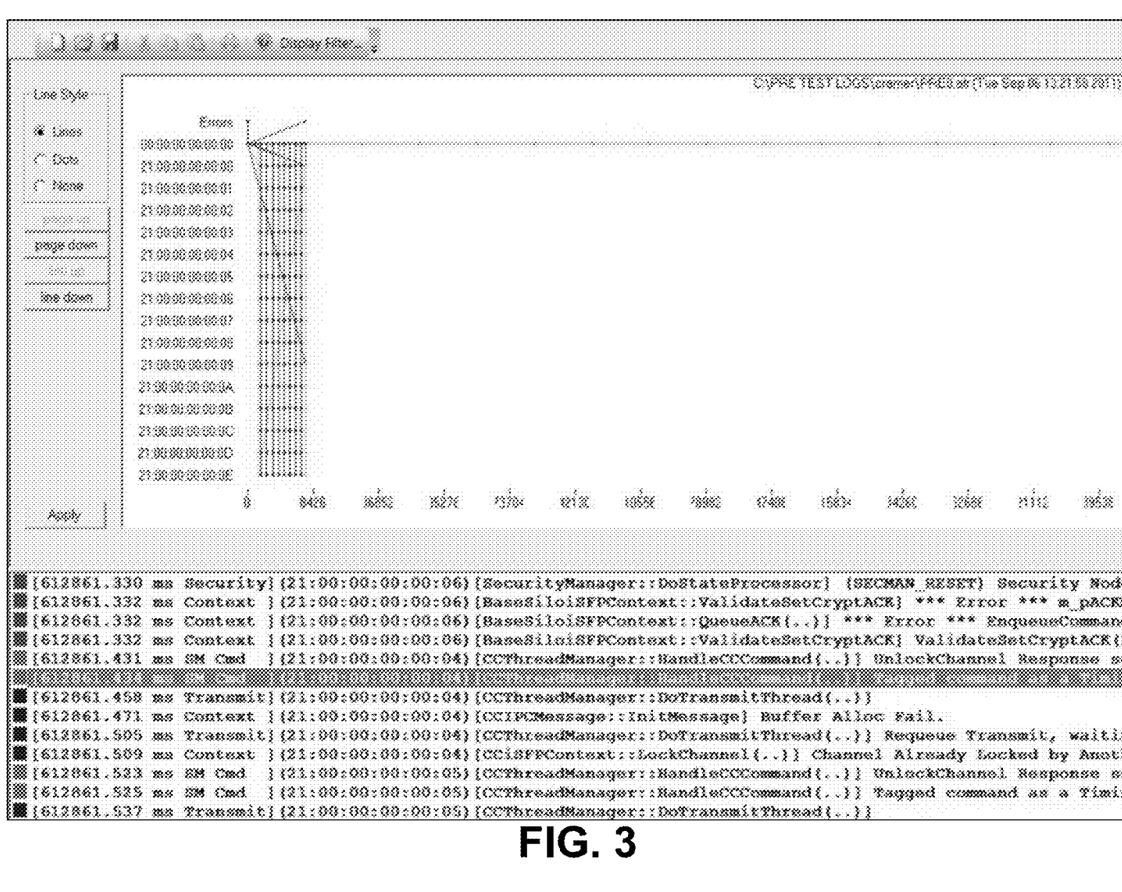
FIG. 3 is a plot of probe number vs time for various threads from the logging system of the present invention.
Figure 4:
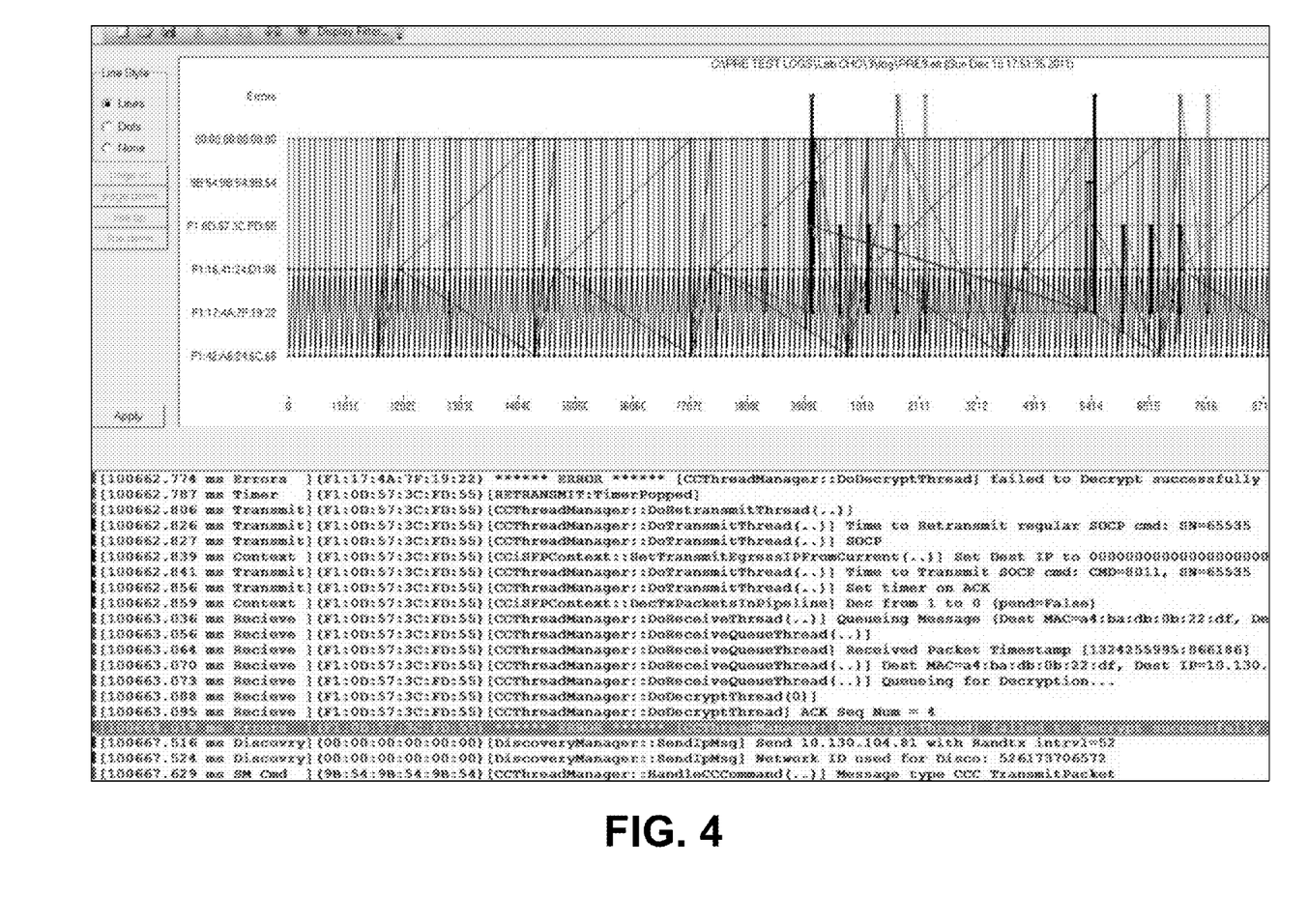
FIG. 4 is a plot of probe number vs time for various threads from the logging system of the present invention.

With reference to FIGS. 3 and 4, the labels on the Y-axis are the probe IDs and the X-axis is time in microseconds. The top line on the Y-axis is not a probe ID, but an error. The colored lines, each represent a distinct execution thread. The colors correspond to the blocks in the text display down below. The plot, for a particular color shows how the thread of execution is moving between doing work for each probe 22 in turn, over time. If that thread of execution logs an error, the point on the plot is done on the top Error Line, which is convenient as it enables errors to be seen quickly. Accordingly, each graph illustrates patterns and errors. There are several different types of threads, e.g. is a 'packet receive' thread. The only thing a packet receive thread does is camp on a network socket and wait for incoming packets to arrive. Every time it gets a packet it logs a 'packet receive event'. Part of that event specifies which probe the packet came from. So often you can see the line for that thread stair-stepping from probe line to probe line as it receives packets from different probes over time. There are many other threads with other work to do. Packet dispatch thread, packet encrypt thread, packet transmit thread, time sync thread. Typically, each PRE 26 can have up to 100 distinct threads, making debugging/tuning all of them extremely difficult without the present invention.

In the graph of FIG. 3, a couple of errors are illustrated, and the processing threads that were cycling between all the probes, servicing them in turn, suddenly stop at approximately time 8400. The cause of the stoppage cannot directly be determined from the graph; however, the graph helps to quickly hone in on the correct textual messages listed below the graph. Accordingly, by reviewing the textual messages at approximately the time of the stoppage, and the textual messages associated with the errors, the cause of the error can be determined. The ability to quickly find the textual message relating to the problem is important since one file may contains hundreds or thousands of events. Trying to page though them to find a problem would be nearly impossible.

The graph in FIG. 4 illustrates a very consistent base-line of thread processing with two repeating patterns that occurred and included some errors, starting around 39090 and 5414. Note that the tool has a defect where some of the time stamps on the X-axis are not getting fully displayed, so they don't look like they are strictly increasing.

Accordingly, the present invention provides a log of execution of many threads across many probes and many thousands of events, that can be looked at. Moreover, are all the events are logged while the application is running in its normal, full-speed mode. Often, text logging slows down real-time applications so significantly that the behavior is changed, which often times makes the logs useless, since some issues only reproduce when the application is running full speed under heavy load.

The visualization of the data in the graph by the log viewer helps quickly hone in on an important region of the log to look at. Looking at a few dozen important lines quickly is key when they are embedded in thousands of lines of often repetitive information.

Following is an example of a mapping file, e.g. for message IDs 10 through 34 and their corresponding human readable character strings.

<regStr><idx>10<idx/><str>[StatusMonitor::LogInfo] Depth=%d, Current Size=%d, Max Size=%d, Monitored Entity = %s<str/><regStr/>

<regStr><idx>11<idx/><str>[StatusMonitor::LogInfo] Threshold (%d) Exceeded!!!!, Depth=%d, Current Size=%d, Max Size=%d, Monitored Entity = %s<str/><regStr/>

<regStr><idx>12<idx/><str>AppTrace String Not Found For Index=%d<str/><regStr/>

<regStr><idx>13<idx/><str>[Line %d, %s] ASSERT (%s)<str/><regStr/>

<regStr><idx>14<idx/><str>* Error * [CommandChannel:main] IPCFactory::init( ) Config File Error<str/><regStr/>

```
    <regStr><idx>15<idx/><str>Retransmission Logic is %s.<str/><regStr/>
    <regStr><idx>16<idx/><str>Create ThreadManager<str/><regStr/>
    <regStr><idx>17<idx/><str>>>Simulate      Mode      On.      Reading
Config...<str/><regStr/><regStr><idx>18<idx/><str>Failed   to   open   timerdev   txstamp
file.<str/><regStr/>
    <regStr><idx>19<idx/><str>Failed to close timerdev txstamp file.<str/><regStr/>
    <regStr><idx>20<idx/><str>Failed to seek timerdev txstamp file.<str/><regStr/>
    <regStr><idx>21<idx/><str>Failed to read ptimerdev txstamp file.<str/><regStr/>
    <regStr><idx>22<idx/><str>***      Error      ***      [CCThreadManager::OpenIPC]
openQueueNoConfig(%s) Failed<str/><regStr/>
    <regStr><idx>23<idx/><str>***                 Error                 ***
[CCThreadManager::HandleThreadAction( )] Default case reached Error<str/><regStr/>
    <regStr><idx>24<idx/><str>***                 Error                 ***
[CCThreadManager::DoCCCommandThread( )] Returned Invalid Command<str/><regStr/>
    <regStr><idx>25<idx/><str>       ******      ERROR      ******
[CCThreadManager::DoEncryptThread] failed to allocate a dest encrypt buffer<str/><regStr/>
    <regStr><idx>26<idx/><str>       ******      ERROR      ******
[CCThreadManager::DoEncryptThread] failed to get encypt seq num<str/><regStr/>
    <regStr><idx>27<idx/><str>       ******      ERROR      ******
[CCThreadManager::DoEncryptThread] failed to encrypt<str/><regStr/>
    <regStr><idx>28<idx/><str>[CCThreadManager::DoTransmitThread] CCSIM:TX=
%s<str/><regStr/>
    <regStr><idx>29<idx/><str>[CCThreadManager::DoTransmitThread(..)] No Egress
- CC ACK with PRE_RES_ISFP_UNREACHABLE, Unlocking Channel<str/><regStr/>
    <regStr><idx>30<idx/><str>*** Error *** [CCThreadManager::DoTransmitThread]
Unrecognized Transmit Command<str/><regStr/>
    <regStr><idx>31<idx/><str>[CCThreadManager::DoReceiveThread(..)]       Socket
Read Failure<str/><regStr/>
    <regStr><idx>32<idx/><str>[CCThreadManager::DoReceiveThread(..)]         Not
Queueing Non-SOCP Message<str/><regStr/>
    <regStr><idx>33<idx/><str>[CCThreadManager::DoReceiveThread(..)] Queueing
Message (Dest MAC=%s, Dest IP=%s)<str/><regStr/>
    <regStr><idx>34<idx/><str>[CCThreadManager::DoReceiveTSThread(..)]
Queueing Message (Dest MAC=%s, Dest IP=%s)<str/><regStr/>
```

In other words, a list of mappings of message IDs to text strings exist in a file that the log viewer uses. Two examples if this are the mappings for message IDs 10 and 27:

Message ID: 10 maps to string: "[StatusMonitor::LogInfo] Depth=%d, Current Size=%d, Max Size=%d, Monitored Entity=%s"

Message ID: 27 Maps to string: "**** ERROR **** [CCThreadManager::DoEncryptThread] failed to encrypt"

A record logged with messageID=10, would need 3 32 bit integers and one string in the variable part of the event record since it has 3%d and 1%s in the string.

A record logged with messageID=27, would have no variable data.

The Timestamp and ProbeID are formatted as well. The Event Type is a string that the log viewer knows from the binary type in the record.

When reconstructed in the log viewer, the two entries with the Message ID's above and the format: <time stamp><Event Type><Probe ID><-Message . . . >; would look something like:

00000.032 ms General Info (00:00:00:00:00:00) StatusMonitor::LogInfo] Depth=0, Current Size=1, Max Size=1000, Monitored Entity=Receive Queue 00000.033 ms Encryption (01:02:03:04:05:06) **** ERROR **** [CCThreadManager::DoEncryptThread] failed to encrypt The fact that almost none of these strings are logged in the actual binary log file is part of what makes this log file so compact and the logging fast. Each character would take 1 byte if it were all logged. Since we can log thousands or tens of thousands of records per second, this is important.

I claim:

1. A method comprising:
   receiving, by a device, log entries of events from a plurality of network elements,
       the log entries being grouped by thread based on a particular purpose;
   converting, by the device, each log entry into a log record of log records,
       each log record comprising at least one of:
           information associated with a record length of the log record,
           information associated with a time stamp of data collection at a network element of the plurality of network elements,
           information associated with a thread ID of a thread that logged each event of the events,
           information associated with a category of each event,
           information associated with a message ID code corresponding to a log message, or
           information associated with a network element ID for identifying a respective network element associated with each event;
   storing, by the device, a first plurality of the log records in a first memory buffer to form a log file;
   allocating, by the device and based on an amount of data stored in the first memory buffer, a second memory buffer for a second plurality of the log records;
   queuing, by the device and based on the amount of data stored in the first memory buffer, the first memory buffer to a background thread to write the first plurality of the log records to a disk file,
       the background thread writing the first plurality of the log records to the disk file when one or more processing cycles are not needed by another thread that has a higher priority than the background thread;
   associating, by the device and after the background thread writes the first plurality of the log records to the disk file, the first memory buffer with a free pool; and storing, by the device and based on associating the first memory buffer with the free pool, a third plurality of the log records in the first memory buffer.

2. The method according to claim 1, further comprising: storing a mapping file of text message strings corresponding to a plurality of different message ID codes.

3. The method according to claim 2,
where the first plurality of the log records are compact log records, and
where the method includes:
converting, using the mapping file, the compact log records to full log entries,
the full log entries including message ID codes and log messages; and
providing, for display, the full log entries on a graphic user interface (GUI).

4. The method according to claim 3, where the full log entries are provided, for display, on the GUI by time vs element ID for each thread.

5. The method according to claim 4, further comprising: providing a separate line on the GUI for errors.

6. The method according to claim 1,
where the first plurality of the log records are compact log records, and
where the method includes:
converting the compact log records to full log entries utilizing a remote computer processor and a mapping file,
the mapping file including message ID codes and log messages; and
providing, for display, the full log entries on a graphic user interface (GUI).

7. The method according to claim 6, where the full log entries are provided, for display, on the GUI by time vs element ID for each thread.

8. The method according to claim 7, further comprising: providing a separate line on the GUI for errors.

9. The method according to claim 1, where each network element, of the plurality of network elements, includes a test probe.

10. A device comprising:
a processor, implemented at least partially in hardware, to:
receive log entries of events from a plurality of network elements,
the log entries being grouped by thread based on a particular purpose;
convert each log entry into a log record of log records, each log record comprising at least one of:
information associated with a record length of the log record,
information associated with a time stamp of data collection at a network element of the plurality of network elements,
information associated with a thread ID of a thread that logged each event of the events,
information associated with a category of each event,
information associated with a message ID code corresponding to a log message, or
information associated with a network element ID for identifying a respective network element associated with each event;
store a first plurality of the log records in a first memory buffer to form a log file;
allocate, based on an amount of data stored in the first memory buffer, a second memory buffer for a second plurality of the log records;
queue, based on the amount of data stored in the first memory buffer, the first memory buffer to a background thread to write the first plurality of the log records to a disk file,
the background thread writing the first plurality of the log records to the disk file when one or more processing cycles are not needed by another thread that has a higher priority than the background thread;
associate, after the background thread writes the first plurality of the log records to the disk file, the first memory buffer with a free pool; and
store, based on associating the first memory buffer with the free pool, a third plurality of the log records in the first memory buffer.

11. The device of claim 10, where the processor is further to:
store a mapping file of text message strings corresponding to a plurality of different message ID codes.

12. The device of claim 11,
where the first plurality of the log records are compact log records, and
where the processor is further to:
convert, using the mapping file, the compact log records to full log entries,
the full log entries including message ID codes and log messages; and
provide, for display, the full log entries on a graphic user interface (GUI).

13. The device of claim 12,
where the full log entries are provided, for display, on the GUI by time vs element ID for each thread, and
where the processor is further to:
provide a line on the GUI for errors.

14. The device of claim 10,
where the first plurality of the log records are compact log records, and
where the processor is further to:
convert the compact log records to full log entries utilizing a remote computer processor and a mapping file,
the mapping file including message ID codes and log messages; and
provide, for display, the full log entries on a graphic user interface (GUI).

15. The device of claim 14,
where the full log entries are provided, for display, on the GUI by time vs element ID for each thread, and
where the processor is further to:
provide a line on the GUI for errors.

16. A system comprising:
a device to:
receive log entries of events from a plurality of network elements,
the log entries being grouped by thread based on a particular purpose;
convert each log entry into a log record of log records, each log record comprising at least one of:
information associated with a record length of the log record,
information associated with a time stamp of data collection at a network element of the plurality of network elements,
information associated with a thread ID of a thread that logged each event of the events,
information associated with a category of each event, information associated with a message ID code corresponding to a log message, or information associated with a network element ID for identifying a respective network element associated with each event;

store a first plurality of the log records in a first memory buffer to form a log file;

determine, based on an amount of data stored in the first memory buffer, that a second plurality of the log records should be stored in a second memory buffer;

queue, based on the amount of data stored in the first memory buffer, the first memory buffer to a background thread to write the first plurality of the log records to a disk file, the background thread writing the first plurality of the log records to the disk file when one or more processing cycles are not needed by another thread that has a higher priority than the background thread;

associate, after the background thread writes the first plurality of the log records to the disk file, the first memory buffer with a free pool; and store, based on associating the first memory buffer with the free pool, a third plurality of the log records in the first memory buffer.

17. The system of claim 16, where the device is further to:
store a mapping file of text message strings corresponding to a plurality of different message ID codes.

18. The system of claim 17,
where the first plurality of the log records are compact log records, and
where the device is further to:
convert, using the mapping file, the compact log records to full log entries,
the full log entries including message ID codes and log messages; and
provide, for display, the full log entries on a graphic user interface (GUI).

19. The system of claim 18,
where the full log entries are provided, for display, on the GUI by time vs element ID for each thread, and
where the device is further to:
provide a line on the GUI for errors.

20. The system of claim 16,
where the first plurality of the log records are compact log records, and
where the device is further to:
convert the compact log records to full log entries utilizing a remote computer processor and a mapping file,
the mapping file including message ID codes and log messages; and
provide, for display, the full log entries on a graphic user interface (GUI).

* * * * *